United States Patent
Shibata et al.

(10) Patent No.: US 10,608,851 B2
(45) Date of Patent: Mar. 31, 2020

(54) CONTINUOUS-TIME SAMPLER CIRCUITS

(71) Applicant: Analog Devices Global Unlimited Company, Hamilton (BM)

(72) Inventors: Hajime Shibata, Toronto (CA); Brian Holford, High Point, NC (US); Trevor Clifford Caldwell, Toronto (CA); Siddharth Devarajan, Arlington, MA (US)

(73) Assignee: ANALOG DEVICES GLOBAL UNLIMITED COMPANY, Hamilton (BM)

( * ) Notice: Subject to any disclaimer, the term of this patent is extended or adjusted under 35 U.S.C. 154(b) by 8 days.

(21) Appl. No.: 15/896,355

(22) Filed: Feb. 14, 2018

(65) Prior Publication Data

US 2019/0253286 A1 Aug. 15, 2019

(51) Int. Cl.
*H03M 1/12* (2006.01)
*H04L 25/06* (2006.01)
(Continued)

(52) U.S. Cl.
CPC ............ *H04L 25/069* (2013.01); *G01R 13/34* (2013.01); *G11C 7/222* (2013.01); *G11C 27/02* (2013.01);
(Continued)

(58) Field of Classification Search
CPC . H03H 11/26; H03K 5/00; H03K 5/06; H03K 5/159; H03K 7/08; H03K 17/00;
(Continued)

(56) References Cited

U.S. PATENT DOCUMENTS 3,810,126 A 5/1974 Butler et al.
4,117,409 A 9/1978 O'Brien
(Continued)

FOREIGN PATENT DOCUMENTS

| EP | 3 104 181 | 12/2016 |
| EP | 3 113 367 | 1/2017 |
| WO | 94/06121 | 3/1994 |

OTHER PUBLICATIONS

International Search Report and Written Opinion in PCT/EP19/053135 dated Apr. 23, 2019, 16 pages.
Wikipedia, *Analog Delay Line*, Apr. 12, 2019, 4 pages.
Grave et al., *Spatially Interleaved Architecture for High-Frequency Data Converters*, 978-1-4799-5341-7/16 © 2016 IEEE, 4 pages.
Gabriele Manganaro, "*3.2.3—Time-to-digital and digital-to-time converters*", 3.2 Emerging Architectures and Techniques, Nov. 17, 2011, Cambridge University Press, 13 pages.

*Primary Examiner* — Shawkat M Ali
(74) *Attorney, Agent, or Firm* — Patent Capital Group

(57) ABSTRACT

A continuous-time sampler has series-connected delay lines with intermediate output taps between the delay lines. Signal from an output tap can be buffered by an optional voltage buffer for performance. A corresponding controlled switch is provided with each output tap to connect the output tap to an output of the continuous-time sampler. The delay lines store a continuous-time input signal waveform within the propagation delays. Controlling the switches corresponding to the output taps with pulses that match the propagation delays can yield a same input signal value at the output. The continuous-time sampler effectively "holds" or provides the input signal value at the output for further processing without requiring switched-capacitor circuits that sample the input signal value onto some capacitor. In some cases, the continuous-time sampler can be a recursively-connected delay line. The continuous-time sampler can be used as the front end sampler in a variety of analog-to-digital converters.

20 Claims, 16 Drawing Sheets

(51) Int. Cl.
*H04L 12/26* (2006.01)
*H04L 27/156* (2006.01)
*G11C 27/02* (2006.01)
*G11C 7/22* (2006.01)
*G01R 13/34* (2006.01)

(52) U.S. Cl.
CPC ......... *G11C 27/024* (2013.01); *H03M 1/1245* (2013.01); *H03M 1/1255* (2013.01); *H04L 27/1563* (2013.01); *H04L 43/0852* (2013.01)

(58) Field of Classification Search
CPC ............ H03M 1/00; H03M 1/06; H03M 1/12; H03M 1/46; H03M 1/1255; H04L 25/069; H04L 27/1563; H04L 43/0852

USPC ........... 327/94, 153, 161, 250; 375/233, 340
See application file for complete search history.

(56) References Cited

U.S. PATENT DOCUMENTS

| | | | |
|---|---|---|---|
| 4,825,103 | A | 4/1989 | Hornak |
| 5,471,162 | A | 11/1995 | McEwan |
| 6,570,411 | B1 | 5/2003 | Bardsley et al. |
| 9,800,228 | B2* | 10/2017 | Hidri .................... H03M 1/1215 |
| 2005/0132399 | A1* | 6/2005 | Smith .................... G06F 21/725 |
| | | | 725/31 |
| 2016/0020778 | A1* | 1/2016 | Bogner ............... H03M 1/0863 |
| | | | 341/161 |
| 2017/0005640 | A1 | 1/2017 | Hidri |

* cited by examiner

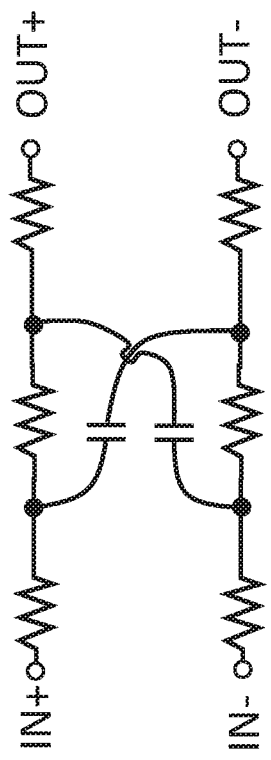
FIGURE 15
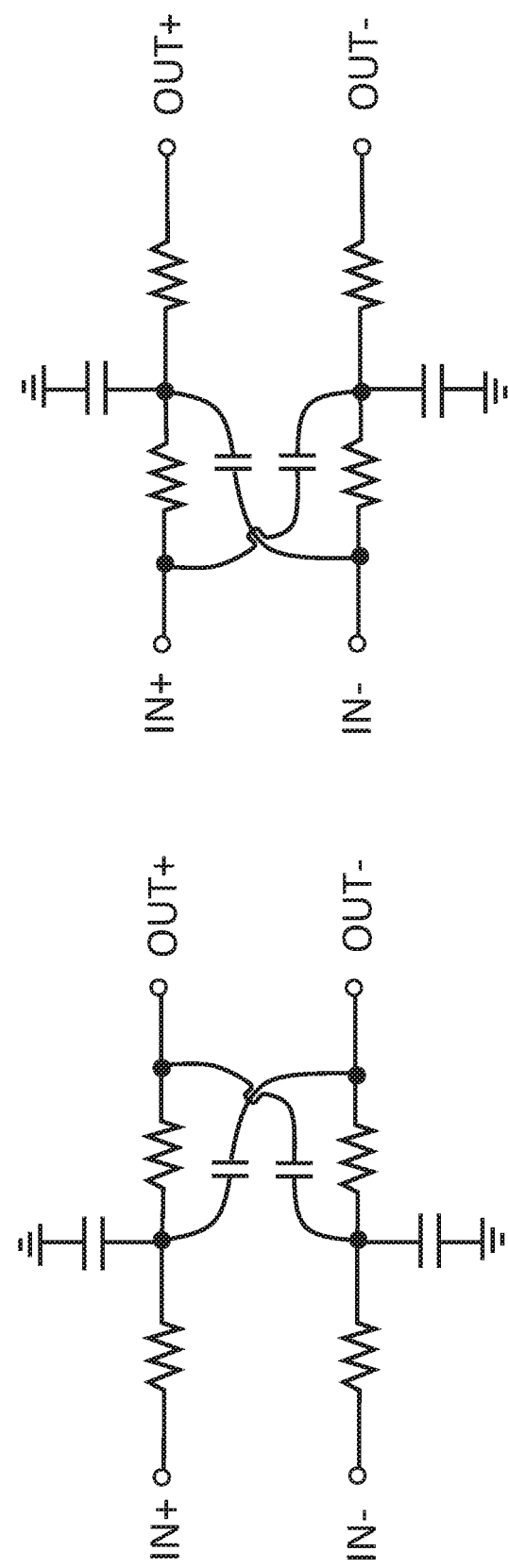
FIGURE 17
FIGURE 16

CONTINUOUS-TIME SAMPLER CIRCUITS

TECHNICAL FIELD OF THE DISCLOSURE

The present disclosure relates generally to analog circuits, and, more particularly, to continuous-time sampler circuits.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomena, e.g., light, sound, temperature or pressure for data processing purposes. ADCs are used in a broad range of applications including Communications, Energy, Healthcare, Instrumentation and Measurement, Motor and Power Control, Industrial Automation and Aerospace/Defense. Designing an ADC is a non-trivial task because each application may have different needs in speed, performance, power, cost and size. As the applications needing ADCs grow, the need for accurate and reliable conversion performance also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 15-17 illustrate resistor-capacitor lattice delay lines, according to some embodiments of the disclosure.

DESCRIPTION OF EXAMPLE EMBODIMENTS OF THE DISCLOSURE

Figure 1:
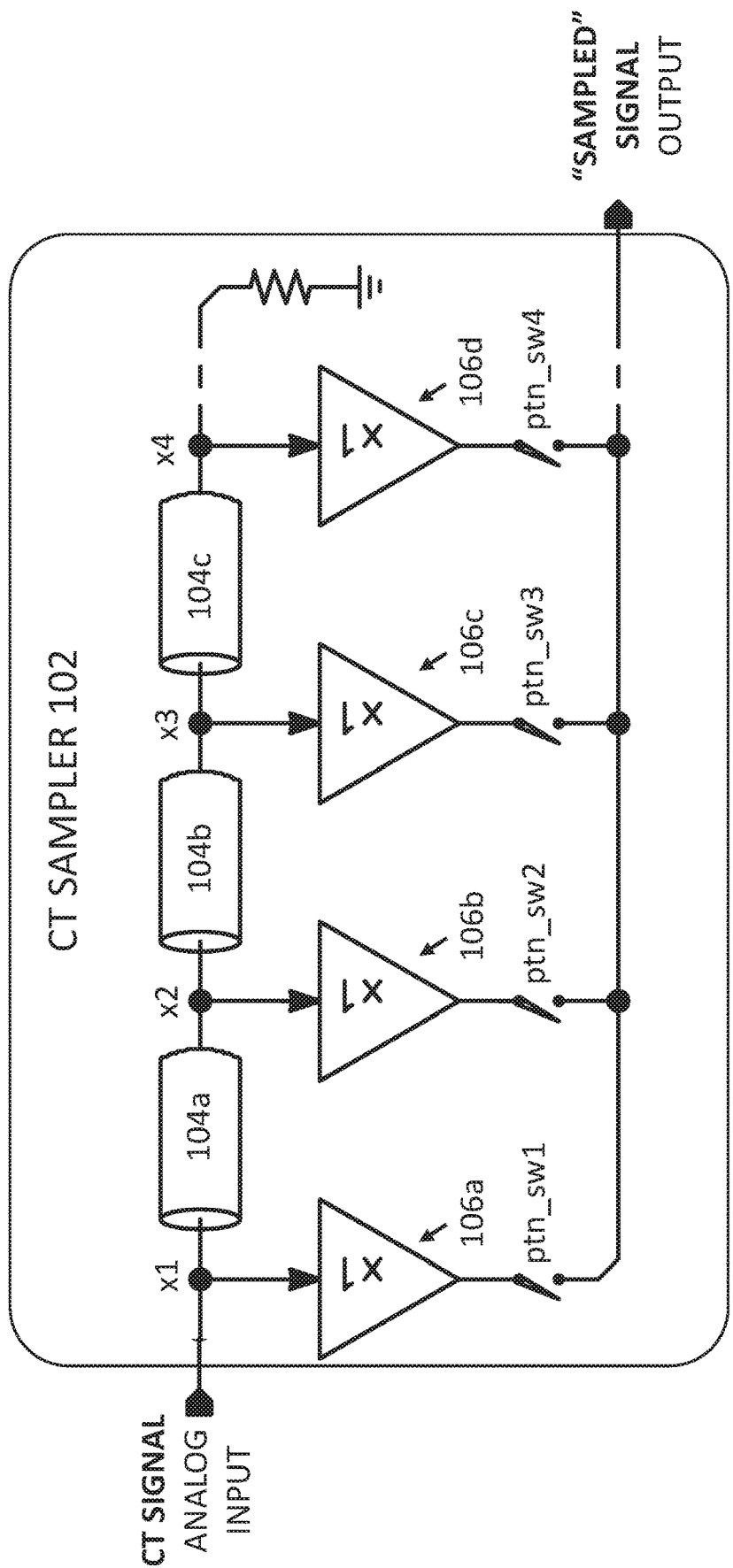
FIG. 1 illustrates an exemplary continuous-time sampler, according to some embodiments of the disclosure.

A continuous-time sampler has series-connected delay lines with intermediate output taps between the delay lines. Signal from an output tap can be buffered by an optional voltage buffer for performance. A corresponding controlled switch is provided with each output tap to connect the output tap to an output of the continuous-time sampler. The delay lines store a continuous-time input signal waveform within the propagation delays. Controlling the switches corresponding to the output taps with pulses that match the propagation delays can yield a same input signal value at the output. The continuous-time sampler effectively "holds" or provides the input signal value at the output for further processing without requiring switched-capacitor circuits that sample the input signal value onto some capacitor. In some cases, the continuous-time sampler can be a recursively-connected delay line. The continuous-time sampler can be used as the front end sampler in a variety of ADCs.

Designing ADCs

ADCs are electronic devices that convert a continuous physical quantity carried by an analog signal to a digital number that represents the quantity's amplitude (or to a digital signal carrying that digital number). The conversion involves quantization of the analog input signal, so it would introduce a small amount of error. Typically the quantization occurs through periodic sampling of the analog input signal. The result is a sequence of digital values (i.e., a digital signal) that has converted a continuous-time (CT) and continuous-amplitude analog input signal to a discrete-time and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio (SINAD), effective number of bits (ENOB), signal to noise ratio (SNR), total harmonic distortion (THD), total harmonic distortion plus noise (THD+N), and spurious free dynamic range (SFDR). ADCs have many different designs, which can be chosen based on the application requirements and performance specifications.

One key component for ADCs is the sampler in the front end of many ADCs. A sampler provides the function of sampling a CT analog input signal, storing a value representing the CT analog input signal, and providing the stored value ("sampled value") to circuitry which then converts the stored value to a digital output. Typically, the sampler is a discrete-time (DT) sampler comprising at least a capacitor and a transistor-based switch (e.g., metal-oxide field effect transistor). The sampler is considered a DT sampler due to the switched-capacitor design, where the switch is used to sample a signal onto a capacitor. When the switch is on, the output of the DT sampler tracks the input. When the switch is off, the capacitor provides a held value at the output of the DT sampler. DT samplers incur problems associated with switched-capacitor circuits, such as aliasing, and "kT/C" noise. For wideband applications, these noise sources can be undesirable.

CT Sampler with Delay Lines

Instead of using switched-capacitor circuits, it is possible to effectively provide a CT sampler which can provide a sample-and-hold like operation of a DT sampler. A CT sampler uses delay lines and appropriately controlled switches to store time-shifted waveforms of the input signal within the propagation delays so that the same input value can be made available as the "sampled" output. When delay lines are being used, "kT/C" noise and other issues associated with switched-capacitor circuits can be avoided.

FIG. 1 illustrates an exemplary CT sampler 102, according to some embodiments of the disclosure. The CT sampler 102 has an input receiving a continuous-time signal, seen as "CT SIGNAL ANALOG INPUT", and an output, seen as "'SAMPLED' SIGNAL OUTPUT". To effectively provide a "held" or "sampled" signal over a period of time, the CT sampler is configured in a way to make a same signal value available at the output for several time instants. The same signal value can be evaluated multiple times at those time instants by circuitry that converts the signal value into a digital output.

The CT sampler 102 has serially-connected (or cascaded) delay lines 104a, 104b, 104c, and so on, coupled to the input. A delay line has a first terminal and a second terminal. The delay line 104a has a first terminal coupled to the input, and a second terminal coupled to a first terminal of the delay line 104b. The delay line 104b has a second terminal coupled to a first terminal of the delay line 104c. A CT sampler can have a number of such serially-connected delay lines. The last delay line can be coupled to a resistor, then to ground.

In some embodiments, the CT sampler 102 has output taps along the serially-connected delay lines 104a, 104b, 104c, etc. The output taps are shown as x1, x2, x3, x4, etc. The serially-connected delay lines may have the same amount of signal propagation delay, and the output taps are equally-spaced in terms of signal propagation delay along the delay lines.

The CT sampler 102 has controlled switches ptn_sw1, ptn_sw2, ptn_sw3, ptn_sw4, and so on, corresponding to the output taps (x1, x2, x3, x4, etc.) for connecting the output taps to the output. A controlled switches, when closed, can pass the signal at the corresponding output tap to the output. When open, the controlled switch disconnects the output from the output tap. The controlled switches, ptn_sw1, ptn_sw2, ptn_sw3, ptn_sw4, and so on, are controlled by respective switching signals. In some embodiments, when a switching signal has a logical "high", it closes the respective switch, and when the switching signal has a logical "low", it opens the respective switch.

Figure 2:
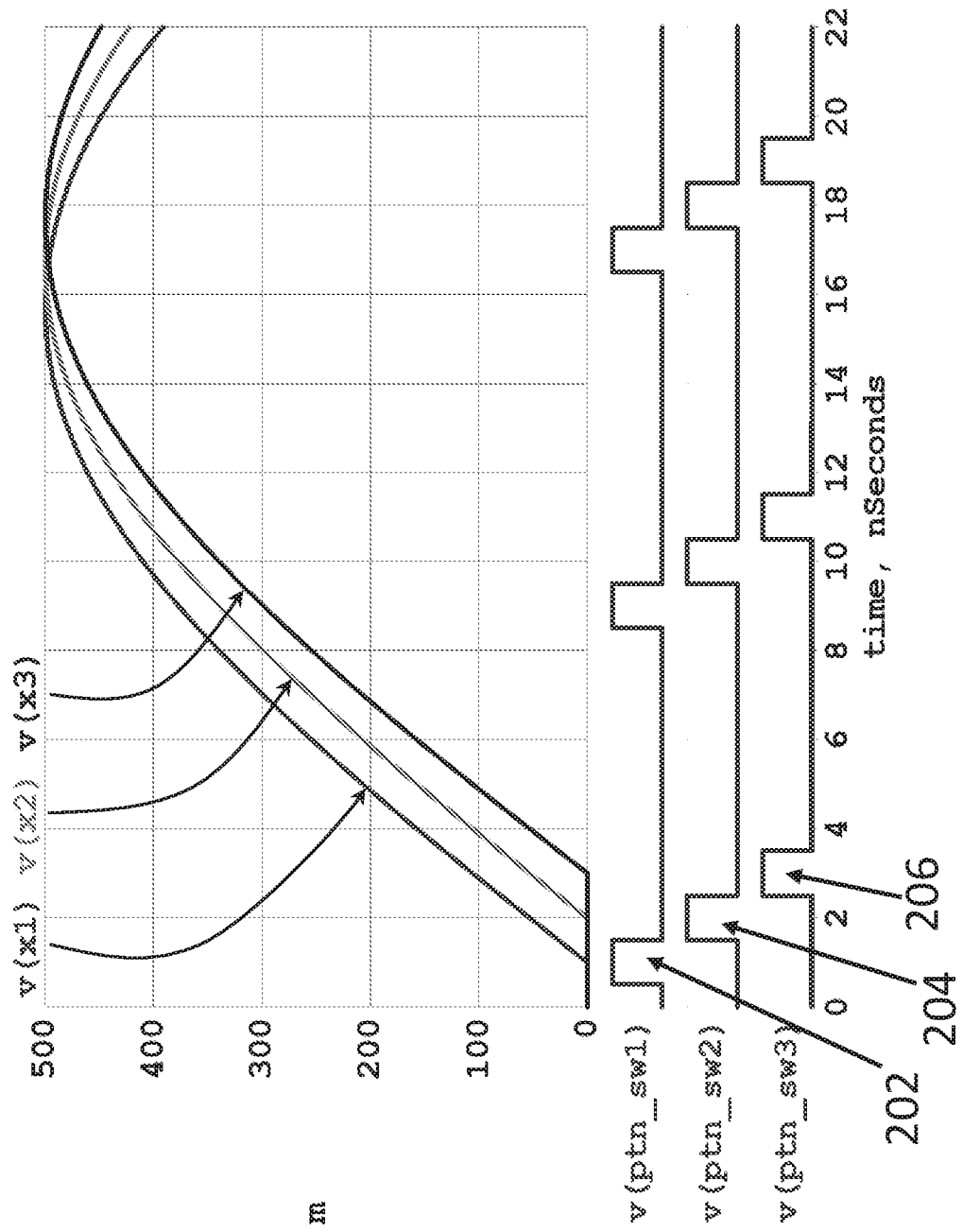
FIG. 2 illustrates voltage waveforms at output taps and voltage waveforms for switching signals controlling controlled switches, according to some embodiments of the disclosure.

FIG. 2 illustrates voltage waveforms at output taps and voltage waveforms for switching signals controlling controlled switches, for the CT sampler 102 of FIG. 1, according to some embodiments of the disclosure. Specifically, voltage waveforms at output taps x1, x2, and x3 are shown. As an example, an input waveform resembling a sinusoid is provided as the input to the CT sampler 102. It can be seen from the plot that that identical but time-shifted waveforms are present at the output taps. The voltage waveform v(x2) at output tap x2 is the same as the voltage waveform v(x1), but time-shifted by the amount of propagation delay of the delay line 104a. The voltage waveform v(x3) at output tap x3 is the same as the voltage waveform v(x1), but time-shifted by the amount of propagation delay of the delay lines 104a and 104b. The voltage waveform v(x3) at output tap x3 is also the same as the voltage waveform v(x2), but shifted by the amount of propagation delay of the delay line 104b.

The switching signals v(ptn_sw1), v(ptn_sw2), and v(ptn_sw3) as shown in FIG. 2, control the controlled switches ptn_sw1, ptn_sw2, and ptn_sw3. A logical "high" signal closes the switch, and a logical "low" signal open the switch. A switching signal can have a pulse, e.g., pulse 202, pulse 204, or pulse 206, which closes the switch for a clock cycle (switch is otherwise open). The switching signals v(ptn_sw1), v(ptn_sw2), and v(ptn_sw3) have respective pulses that serially close the respective controlled switches one by one. The pulses of the switching signals match and follow the signal propagation delays associated with the serially-connected delay lines. Moreover, the pulses seen in voltage waveforms v(ptn_sw1), v(ptn_sw2), and v(ptn_sw3) move in the same direction and magnitude in terms of propagation delays as the time-shifted waveforms v(x1), v(x2), and v(x3).

Figure 3:
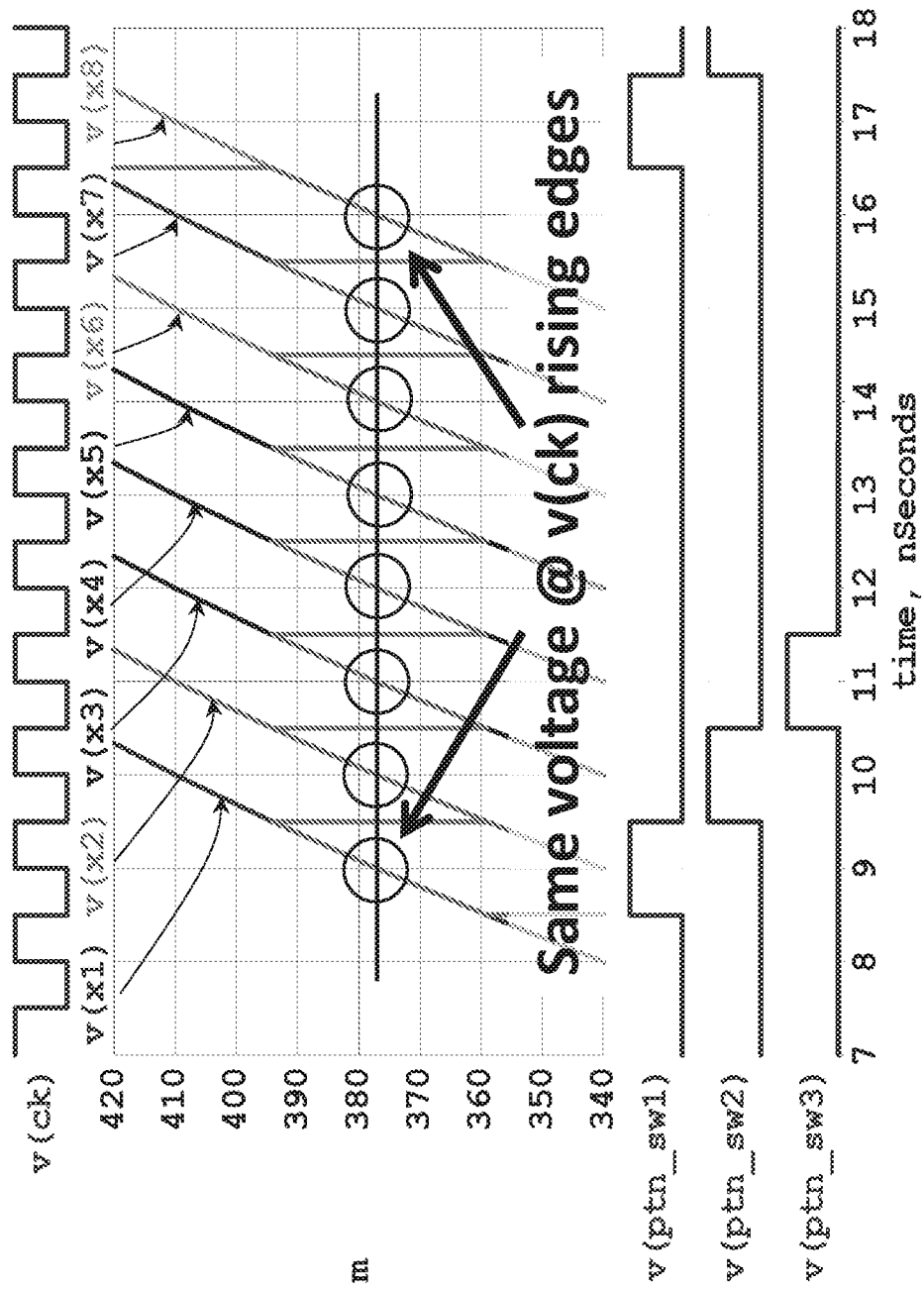
FIG. 3 illustrates how a same voltage can be evaluated for each clock period, according to some embodiments of the disclosure.

FIG. 3 illustrates how a same voltage can be evaluated for each clock period, according to some embodiments of the disclosure. When pulses of the switching signals match and follow the propagation delays of the waveforms at the output taps, it is possible to obtain a same signal value every clock cycle. The voltage at the output of the CT sampler can have a sawtooth waveform, where each clock cycle, the output follows the voltage at the output tab connected to the output. With a clock signal v(ck) and pulses (having duration of a clock cycle) serially closing the switches as shown, a same voltage can be obtained at several consecutive rising edges of the clock v(ck). This means that effectively a "held" or "sampled" output, i.e., a same signal value, appears at the output of the CT sampler 102 at several rising edges of the clock v(ck). In other words, the output has a same signal value of the continuous-time signal at time instants defined by a plurality of consecutive clock edges when the pulses connect the output taps to the output. The sample-and-hold like operation is achieved, without switched-capacitor circuitry.

Referring back to FIG. 1, voltage buffers 106a, 106b, 106c, 106d, etc. can be included for performance. The voltage buffers, placed between the respective output taps and the respective controlled switches, can buffer 106a, 106b, 106c, 106d respective signals at the output taps x1, x2, x3, x4, etc.

Using delay lines and controlled switches to build a CT sampler can avoid issues traditionally associated with switched-capacitor samplers. With a CT sampler, there can be zero noise and linear behavior, where as a DT sampler can have kT/C noise and non-linearities. A CT sampler can be easier to drive due to its resistive input. A CT sampler may incur additional area, where the additional area can depend on the delay line implementation. Also, designing a CT sampler can be challenging due to the sensitive timing of the pulses in the switching signals relative to the propagation delays.

For simplicity, single-ended implementations are shown, but one skilled in the art can readily recognize that the embodiments shown herein can have corresponding differential implementations.

Addressing Sensitive Timing of the CT Sampler

Figures 4A, 4B:
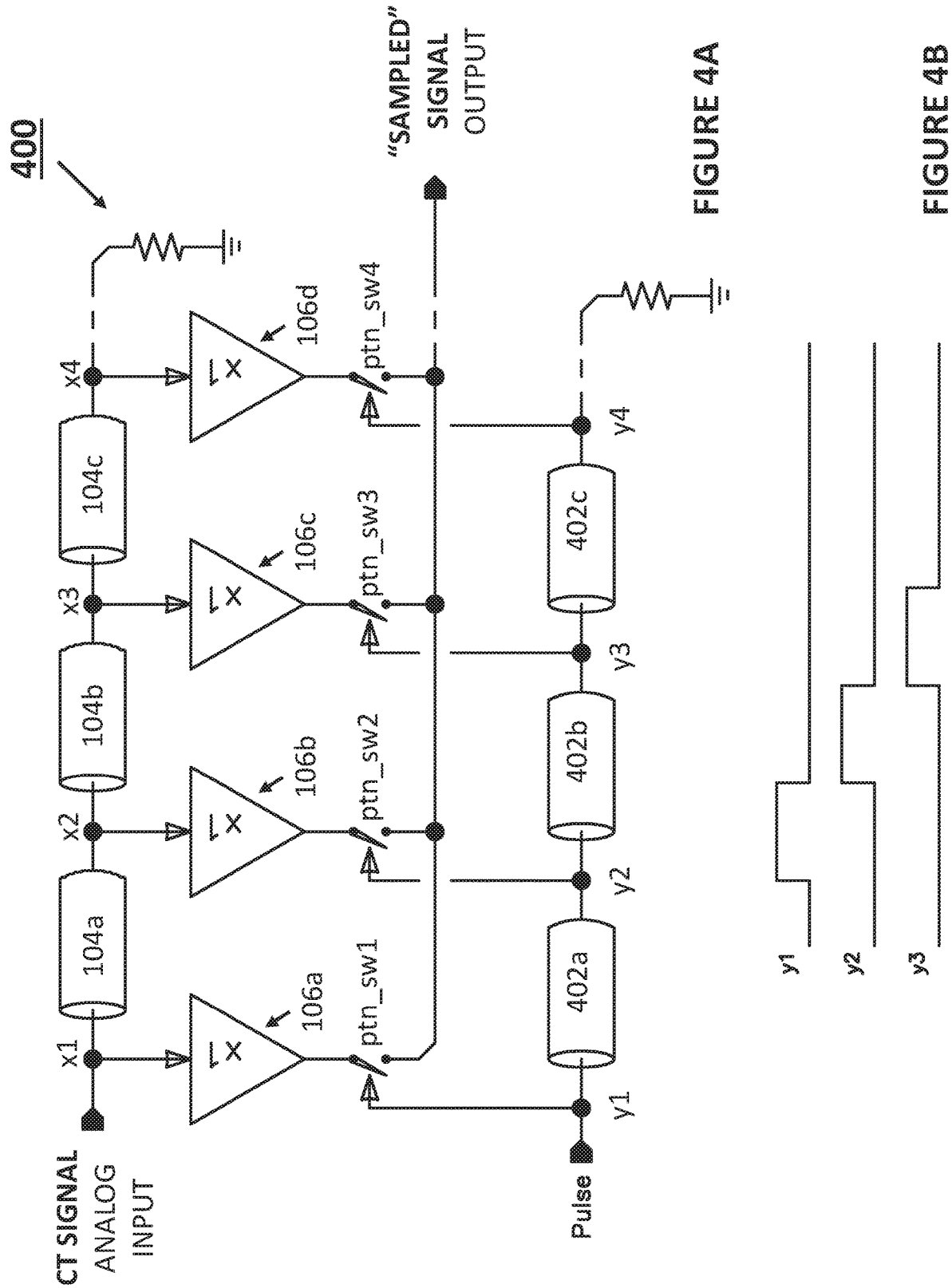
FIG. 4A illustrates an exemplary continuous-time sampler with delay lines generating switching signals, according to some embodiments of the disclosure.
FIG. 4B shows voltage waveforms at nodes along the delay lines generating switching signals, according to some embodiments of the disclosure.

FIG. 4A illustrates an exemplary continuous-time sampler 400 with delay lines generating switching signals, according to some embodiments of the disclosure. The pulses in the switching signals are ideally matching and following the signal propagation delays associated with the delay lines in the signal path. One way to ensure the matching is to provide structurally identical delay lines for generating the switching signals. The CT sampler 400 includes further serially-connected delay lines 402a, 402b, 402c, and so on, receiving a pulse, and further output taps y1, y2, y3, y4, and so on, along the further serially-connected delay lines for generating the switching signals controlling switches ptn_sw1, ptn_sw2, ptn_sw3, ptn_sw4, and so on, having the pulses. The further serially-connected delay lines 402a, 402b, 402c, and so on, match in structure with the serially-connected delay lines 104a, 104b, 104c, and so on. FIG. 4B shows voltage waveforms at nodes along the delay lines (e.g., y1, y2, y3) generating switching signals, according to some embodiments of the disclosure. The pulses in the switching signals in the switching signal delay path propagate in the same direction as the continuous-time input signal in the main signal delay path. By having structurally same delay lines, the amount of propagation delay of the two delay paths match by design.

Recursive CT Sampler

Figure 5:
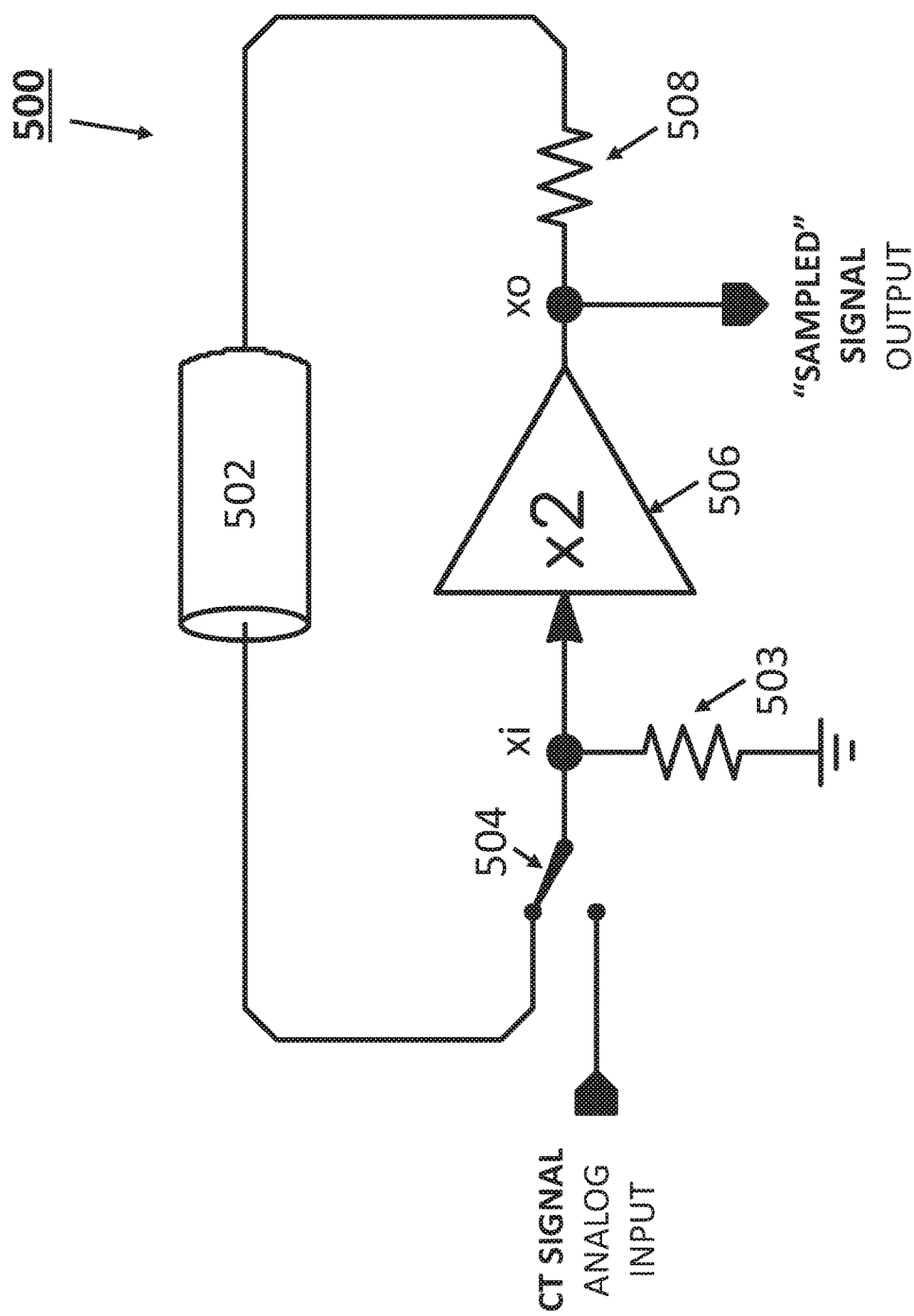
FIG. 5 illustrates an exemplary recursive continuous-time sampler, according to some embodiments of the disclosure.

Instead of having serially-connected (cascaded) delay lines, a CT sampler can be implemented recursively with one or more delay lines configured recursively and reused each clock period to achieve similar results of the CT sampler seen in FIG. 1. FIG. 5 illustrates an exemplary recursive CT sampler 500, according to some embodiments of the disclosure. The recursive CT sampler 500 has an input, seen as "CT SIGNAL ANALOG INPUT", and an output, seen as "'SAMPLED' SIGNAL OUTPUT". The recursive CT sampler 500 includes a delay line 502 in a recursive configuration, referred herein as a "recursive-connected delay line". Connected to the tap xi is a grounded resistor 503. A voltage buffer 506 can be included to buffer the signal at the tap xi, prior to providing the signal at the tap xi to the output of the CT Sampler labeled as tap xo. The gain of the voltage buffer can be approximately x2. In the recursive loop, the recursive CT sampler 500 has voltage buffer 506, followed by tap xo, followed by a resistor 508, and followed by the delay line 502. The resistor 508 is connected to a first terminal of delay line 502.

First, the tab xi can be connected to the input to receive the continuous-time input signal. Subsequently, the tab xi can be disconnected from the input, and disconnected from receiving the continuous-time input signal using switch 504. The tab xi can be connected a second terminal of delay line 502 to form the recursive loop. The recursive loop uses delay line 502 to capture the time-shifted waveforms of the continuous-time input signal, and makes the time-shifted waveforms available for evaluation at the output of the recursive CT sampler 500.

The recursive loop captures time-shifted waveforms of a continuous-time input signal received at an input by one or more recursively-connected delay lines. At a plurality of clock edges (for consecutive periods), a same signal value of the continuous-time input signal can be evaluated from the time-shifted waveforms at the output. To capture the first waveform, the tab xi can be connected (using switch 504) to receive the continuous-time input signal. Then to configure the delay line in a recursive manner, the tab xi can be disconnected (using switch 504) from receiving the continuous-time input signal and connected (using switch 504) to receive a delayed signal generated by the first recursively-connected delay lines.

Consider the flow of the continuous-time input signal (i.e., as time-shifted waveforms) through the following propagation paths around the recursive loop:

First signal propagation path: signal flows through Input (t=0), tab xi→voltage buffer 506→output, tab xo Second signal propagation path: signal flows through Input (t=0), tab xi→voltage buffer 506→resistor 508→delay line 502→tab xi→voltage buffer 506→output, tab xo Third signal propagation path: signal flows through Input (t=0), tab xi→voltage buffer 506→resistor 508→delay line 502→tab xi→voltage buffer 506→resistor 508→delay line 502→tab xi→voltage buffer 506→output, tab xo Relative to the shorter signal propagation path, a given signal propagation path incurs additional delay through resistor 508→delay line 502→tab xi→voltage buffer 506. The additional delay relative to the shorter signal propagation path is representative of the delay between the time-shifted waveforms being captured by the recursive CT sampler 500.

The exemplary recursive CT sampler 500 shows one recursive delay line 502, but it is envisioned by the disclosure that multiple cascaded (or serially-connected) recursive delay lines can be used. Some CT samplers can have a combination of serially-connected delay lines and recursively-connected delay lines. By reusing the delay line 502 in a recursive loop to capture the time-shifted waveforms, area can be reduced since the design can avoid having multiple area-intensive serially-connected delay lines.

SAR ADC with CT Sampler

Figure 6:
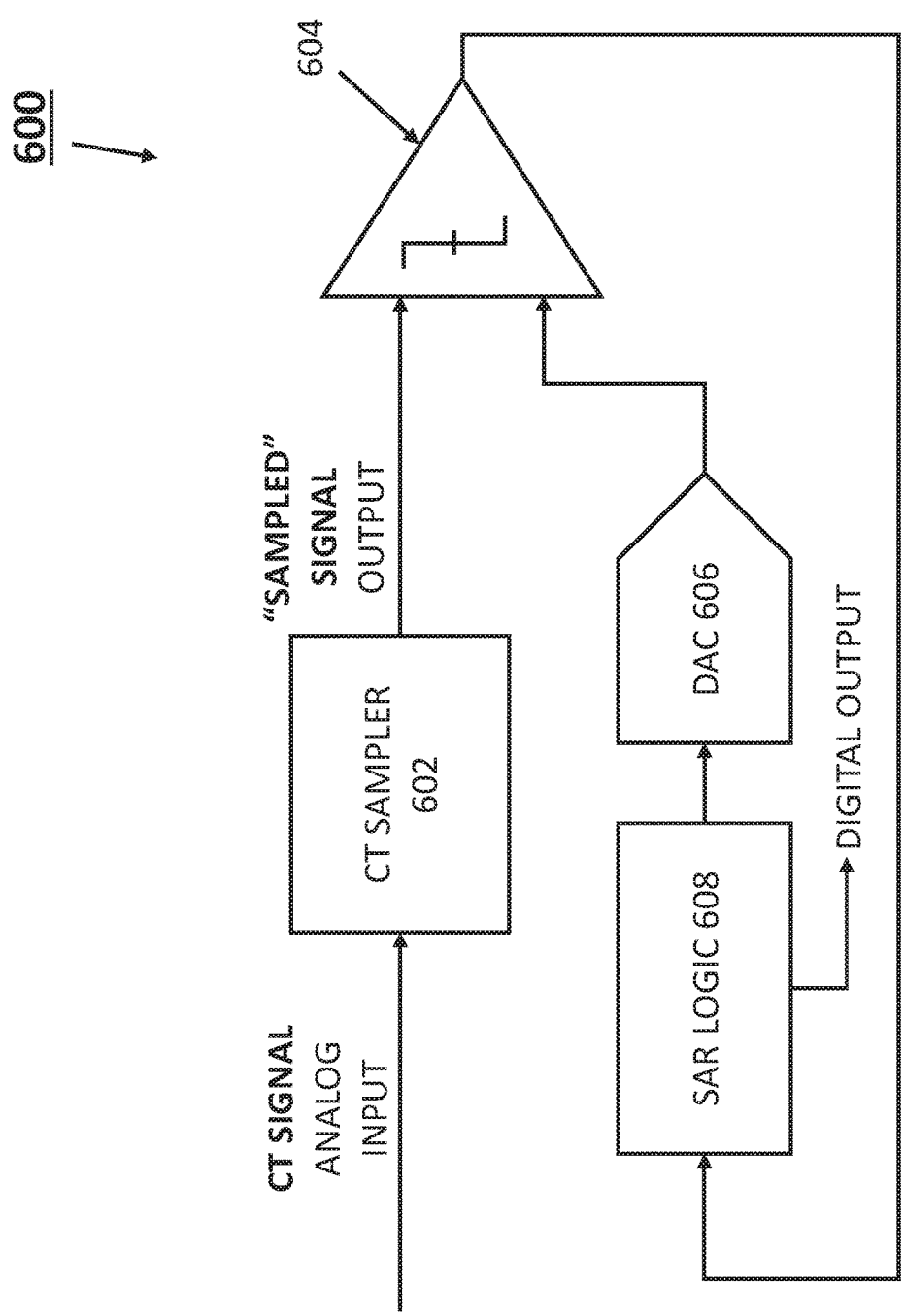
FIG. 6 illustrates an exemplary successive approximation register ADC having a continuous-time sampler, according to some embodiments of the disclosure.

FIG. 6 illustrates an exemplary SAR ADC 600 having a continuous-time sampler, according to some embodiments of the disclosure. The SAR ADC can include a CT sampler 602 (implemented based on any CT sampler described herein), a comparator 604, a digital-to-analog converter (DAC) 606, and SAR logic 608. The output of the CT sampler 602 makes a same signal value of the continuous-time input signal available for the comparator 604 to evaluate multiple times to perform the multi-step algorithm of the SAR ADC 600. The output of the CT sampler is connected to the comparator 604, and the comparator 604 compares the output (i.e., the same signal value) against a plurality of values generated by a DAC 606. The DAC 606 is controlled by SAR logic 608, which implements the SAR algorithm for performing analog-to-digital conversion (i.e., a search algorithm that determines the digital output representing the analog input). The SAR logic 608 is controlled by the comparator 604, which provides feedback to the SAR logic 608 based on the result of the comparison to the SAR logic 608.

Using the CT Sampler in Multi-Step Converters

Broadly speaking, the CT sampler, such as CT sampler 102, CT sampler 400, and CT sampler 602, can be used as a front end sampler for ADCs which perform multiple steps of conversion based on a same signal value evaluated from the CT sampler. An ADC with continuous-time sampling as its front end can include delay means for storing identical time-shifted waveforms of an analog input signal. The delay means can include the delay lines described herein. The ADC can also include output means for outputting time-shifted waveforms of the analog input signal. The output means can be controlled by pulses matching propagation delays of the delay means. The output means can include the output taps and controlled switches described herein. Pulses can control the controlled switches which connect the output taps to an output. The ADC can also include circuitry for performing analog to digital conversion based on a same signal value evaluated from the time-shifted waveforms (from the output means) over a plurality of clock edges. For instance, the circuitry can include a comparator for comparing the same signal value against different values generated by a DAC. Such a configuration can be seen in the example shown in FIG. 6.

In some cases, the output means comprises summing means for summing signal values from the identical time-shifted waveforms. For instances, the controlled switches can connect the output tabs to an output node, which sums the signals from the output tabs to generate a "sampled" signal. Such a configuration can be seen in the example shown in FIG. 1.

If desired, the ADC can include further delay means for generating the pulses, wherein the further delay means for generating the pulses are structurally the same as the delay means to ensure matching of the propagation delays of the delay means and the further delay means. Such a configuration can be seen in the example shown in FIG. 4A.

Delay Line Based Interleaver

Figure 7:
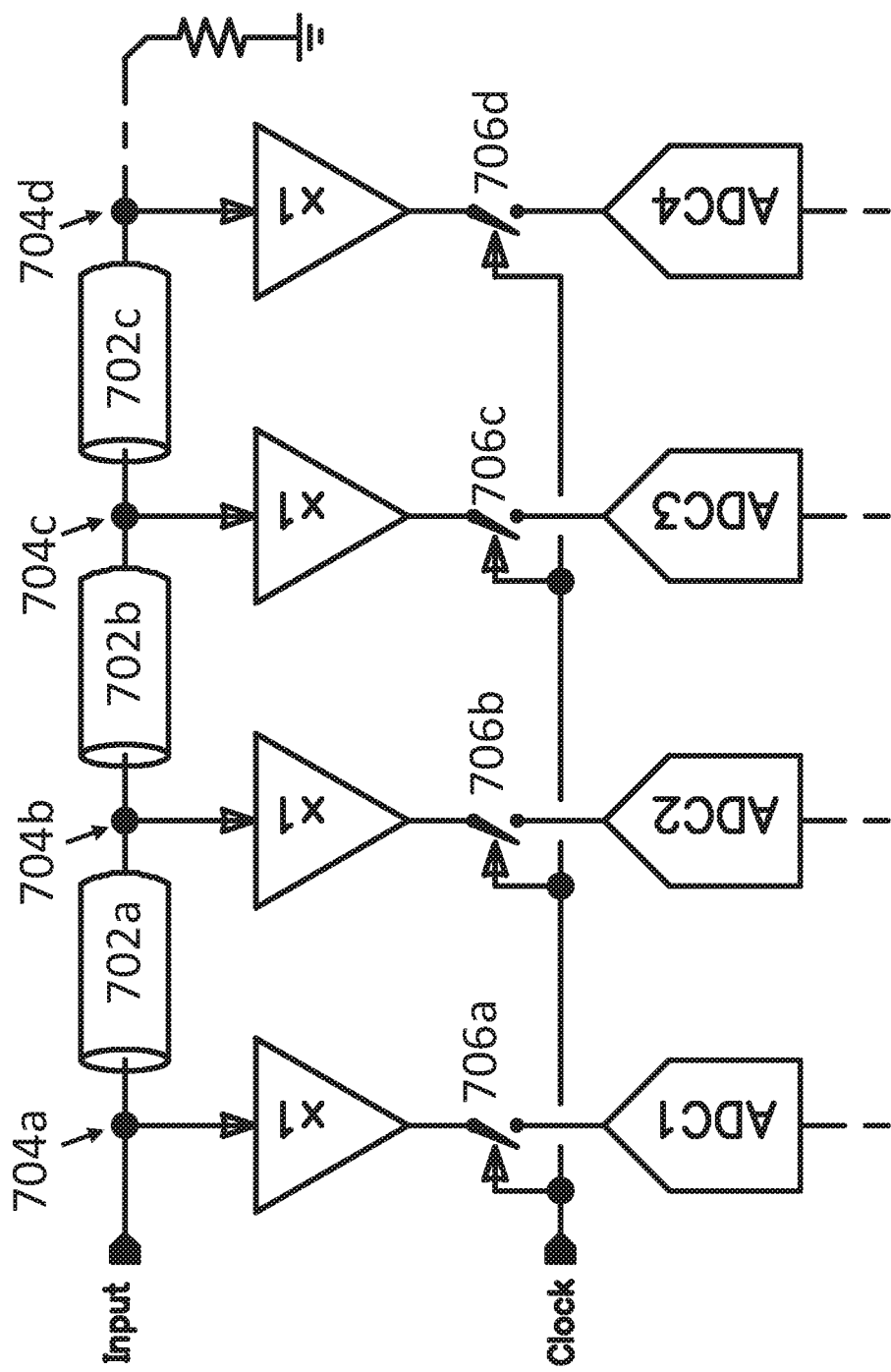
FIG. 7 shows a continuous-time input-side interleaver, according to some embodiments of the disclosure.

Besides providing a sampling function, serially-connected delay lines can capture time-shifted waveforms that can be used for interleaving ADCs. FIG. 7 shows a continuous-time input-side interleaver, according to some embodiments of the disclosure. In this example, the time-shifted waveforms of the input signal are captured by the delay lines 702a, 702b, 702c, and so on. In other words, time-shifted waveforms of the input signal appears at output tabs 704a, 704b, 704c, 704d, and so on. By clocking switches 706a, 706b, 706c, 706d, and so on, using the same clock signal, it is possible for the time-interleaved ADCs (shown as ADC1, ADC2, ADC3, ADC4), to evaluate different signal values of the input signal at the same time. As a result, the time-interleaved ADCs can, in parallel, convert the different signal values into different digital outputs.

Figure 8:
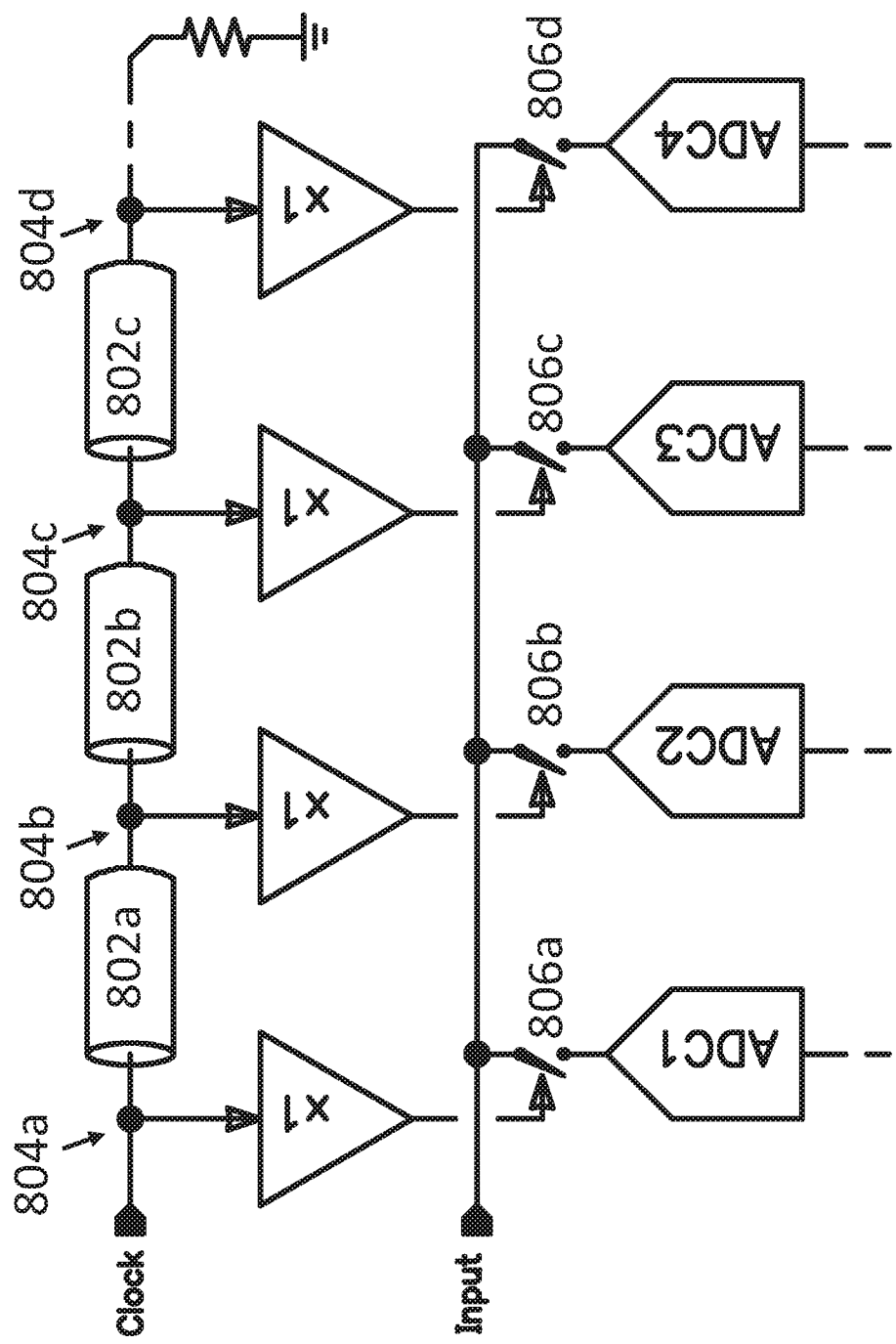
FIG. 8 shows a continuous-time clock-side interleaver, according to some embodiments of the disclosure.

FIG. 8 shows a continuous-time clock-side interleaver, according to some embodiments of the disclosure. In this example, time-shifted waveforms of the clock signal are captured by the delay lines 802a, 802b, 802c, and so on. In other words, time-shifted waveforms of the clock signal appears at output tabs 804a, 804b, 804c, 804d, and so on. By clocking switches 606a, 606b, 606c, 606d, and so on, using the time-shifted clock signals, it is possible for the time-interleaved ADCs (shown as ADC1, ADC2, ADC3, ADC4), to evaluate a different signal value of the input signal (one-after-another). As a result, the time-interleaved ADCs all receiving the same input signal can capture different signal values of the input signal one at a time (controlled by the time-shifted clock signals), and subsequently convert the different signal values into different digital outputs.

Multi-Step ADCs which Utilizes Delay Lines for Storing Time-Shifted Waveforms

Delay lines are effective at capturing time-shifted waveforms, which can be used by respective stages of an ADC to perform multi-step analog-to-digital conversion. Such an ADC can utilize the delay lines and the time-shifted waveforms stored in the delay lines to perform multi-step conversion. FIGS. 9-12 illustrate some examples of such ADC.

Figure 9:
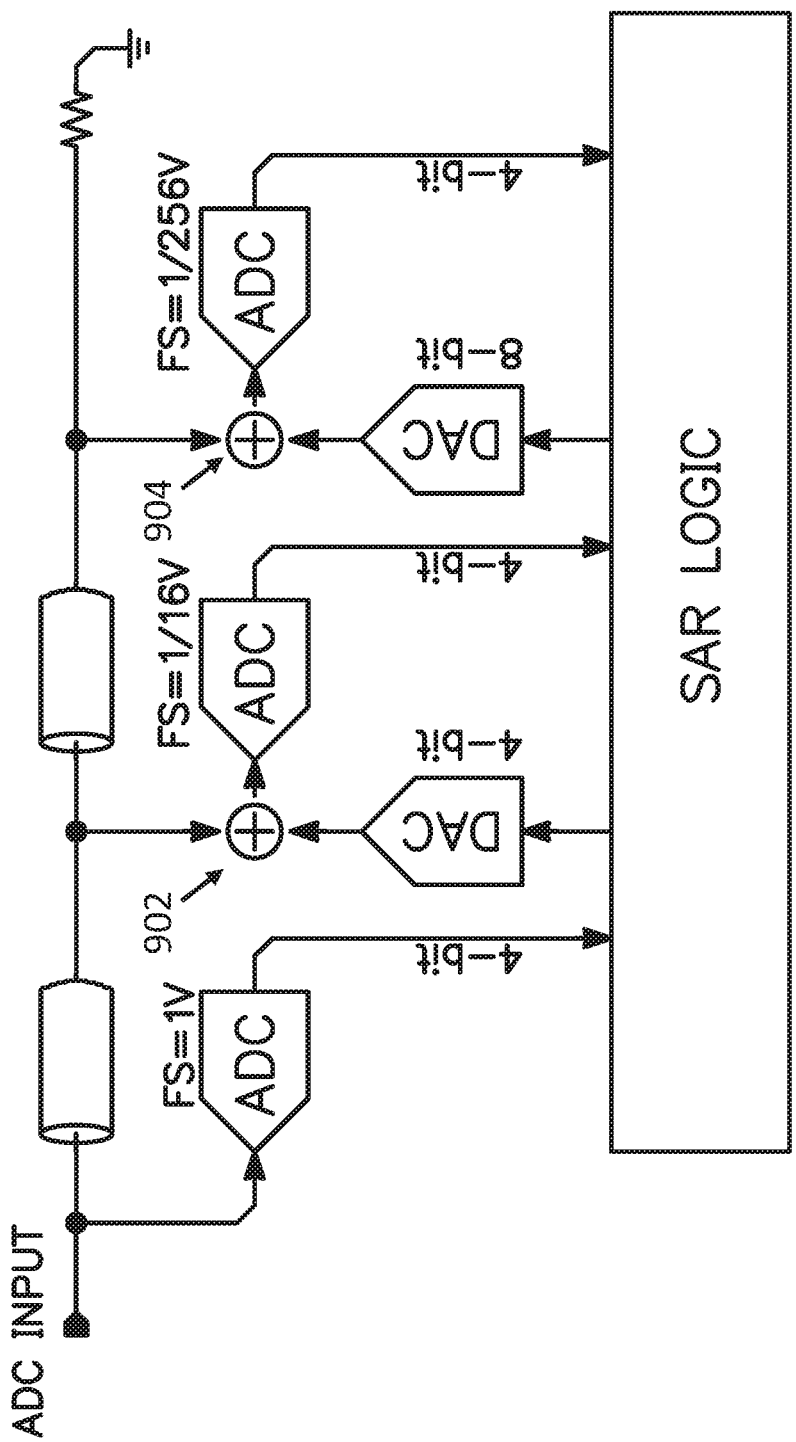
FIG. 9 illustrates an exemplary multi-step ADC with multi-bit decision per stage, according to some embodiments of the disclosure.

FIG. 9 illustrates an exemplary multi-step ADC with multi-bit decision per stage, according to some embodiments of the disclosure. The stored time-shifted waveforms are being used for multi-step conversion, where each step of conversion, performed by different stages of the ADC, can provide multiple bits of resolution. The stages can perform SAR-based analog-to-digital conversion. In this example, the time-shifted waveform can be used to generate a residue for a stage, where the time-shifted waveform is subtracted by an output of a DAC (e.g., performed by summation nodes 902 and 904), and the residue then undergoes the next step of conversion.

Figure 10:
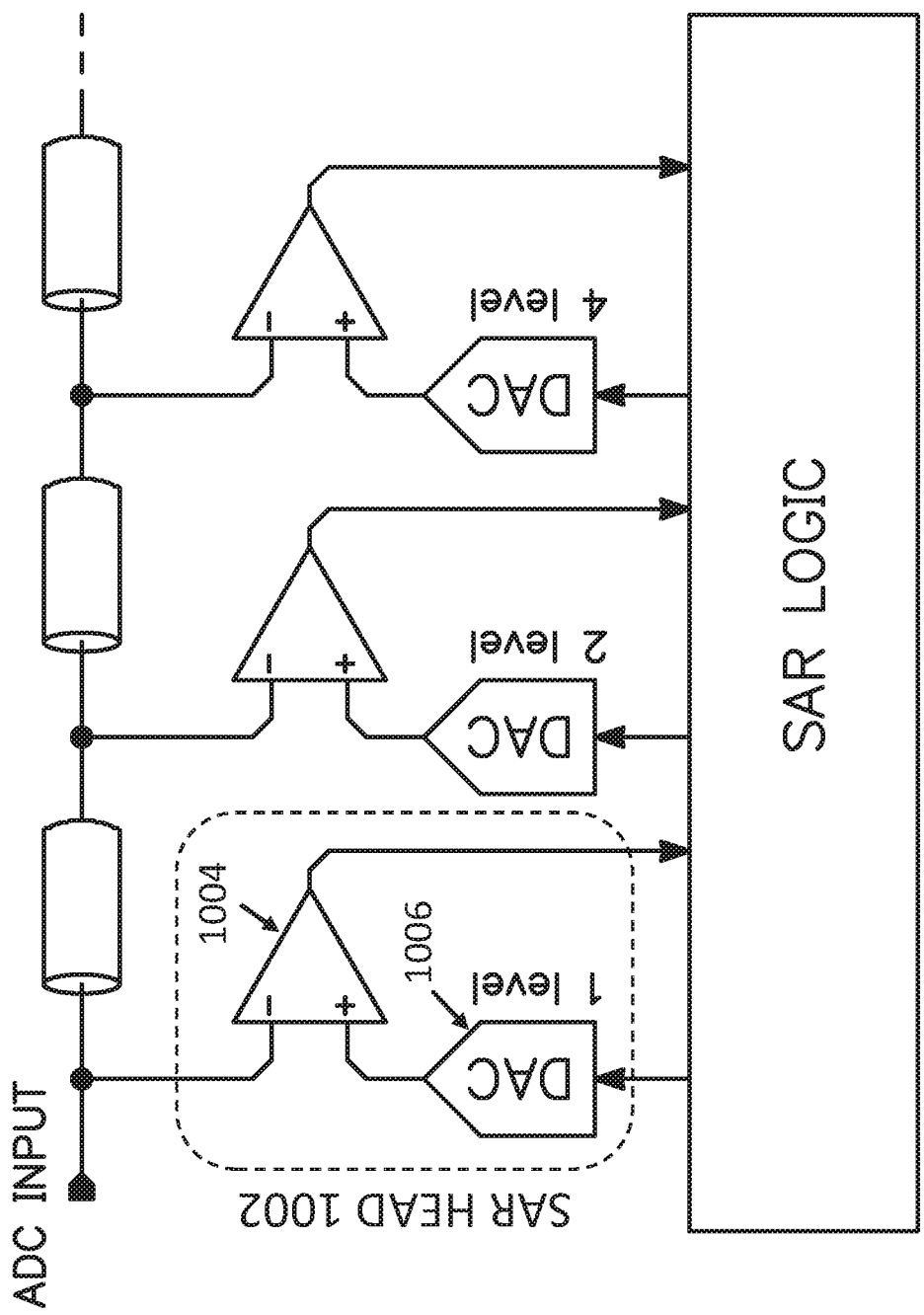
FIG. 10 illustrates an exemplary sub-ranging successive approximation register (SAR) ADC, according to some embodiments of the disclosure.
Figure 11:
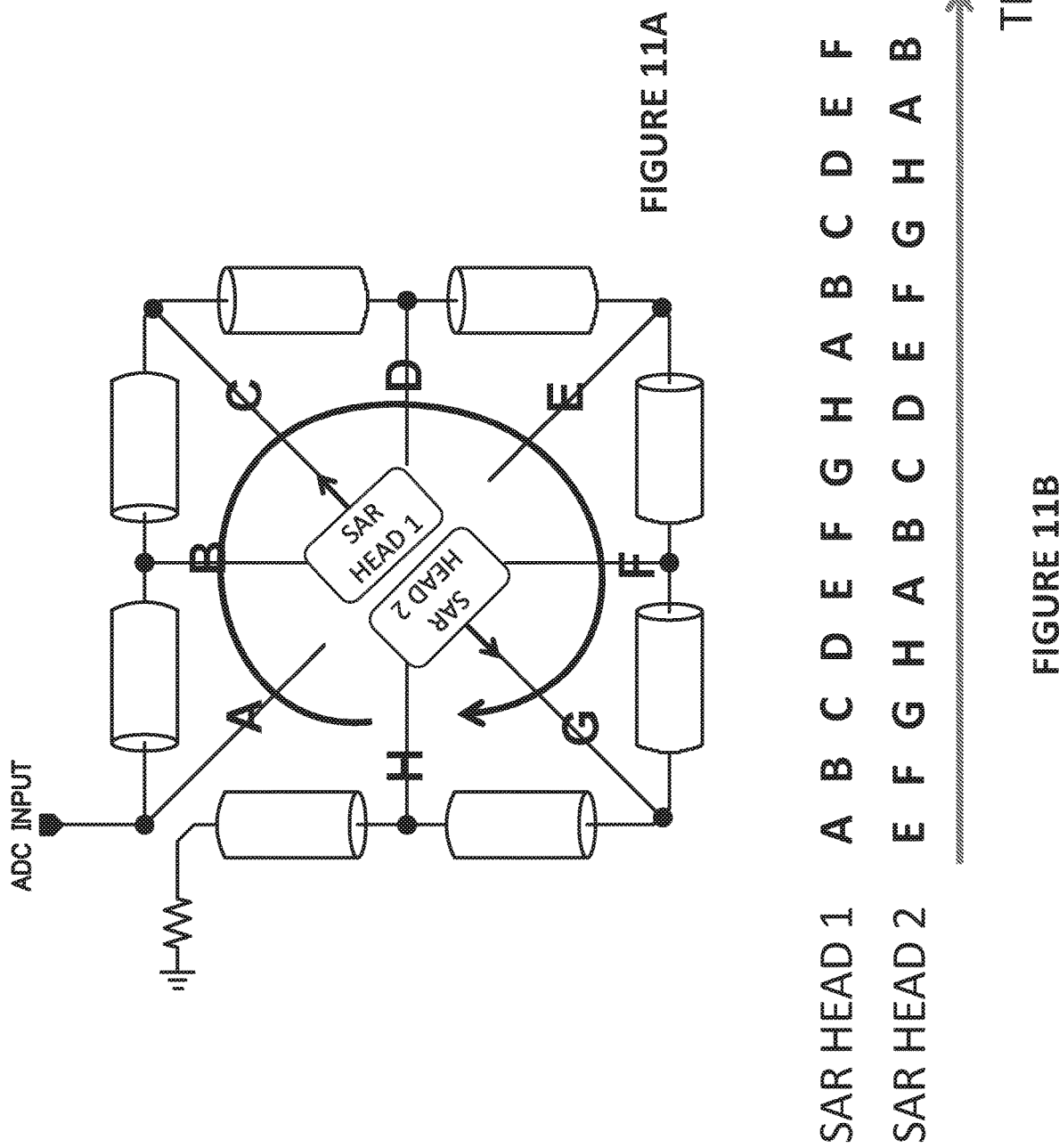
FIG. 11A illustrates an exemplary delay lines with time-interleaved SAR heads, according to some embodiments of the disclosure.
FIG. 11B illustrates connection of time-interleaved SAR heads to output tabs of the delay lines of FIG. 11A, according to some embodiments of the disclosure.

FIG. 10 illustrates an exemplary sub-ranging SAR ADC, according to some embodiments of the disclosure. In this case, the time-shifted waveforms are used by separate SAR ADCs heads, e.g., SAR head 1002. For instance, SAR head 1002 has a comparator 1004 and a DAC 1006. The comparator 1004 compares a time-shifted waveform from an output tap against a signal generated by the DAC 1006. The SAR heads are pipelined, and each SAR head receives a respective time-shifted waveform from the output taps of the delay lines. Pipelining can improve overall speed, and individual SAR heads can be optimized for each stage (e.g., the SAR heads are shown to have DACs having different number of levels).

Besides pipelining, the ADC seen in FIG. 10 can benefit from interleaving to achieve further speed improvement. FIG. 11A illustrates an exemplary delay lines with time-interleaved SAR heads, according to some embodiments of the disclosure. FIG. 11B illustrates connection of time-interleaved SAR heads to the output tabs of the delay lines of FIG. 11A, according to some embodiments of the disclosure. At a given time, two or more SAR heads can be processing time-shifted waveforms captured by the delay lines. Parallel processing by multiple SAR heads at a given time through interleaving can provide significant speed improvement.

It is understood by one skilled in the art that the delay lines for capturing time-shifted can be used for other ADC architectures. For instance, the delay lines can be used for multi-step ADCs which perform redundant decisions. Other multi-step ADCs having a combination different ADC architectures may also benefit from such delay lines.

Cyclic ADC Using a Recursive Delay Line

Figure 12:
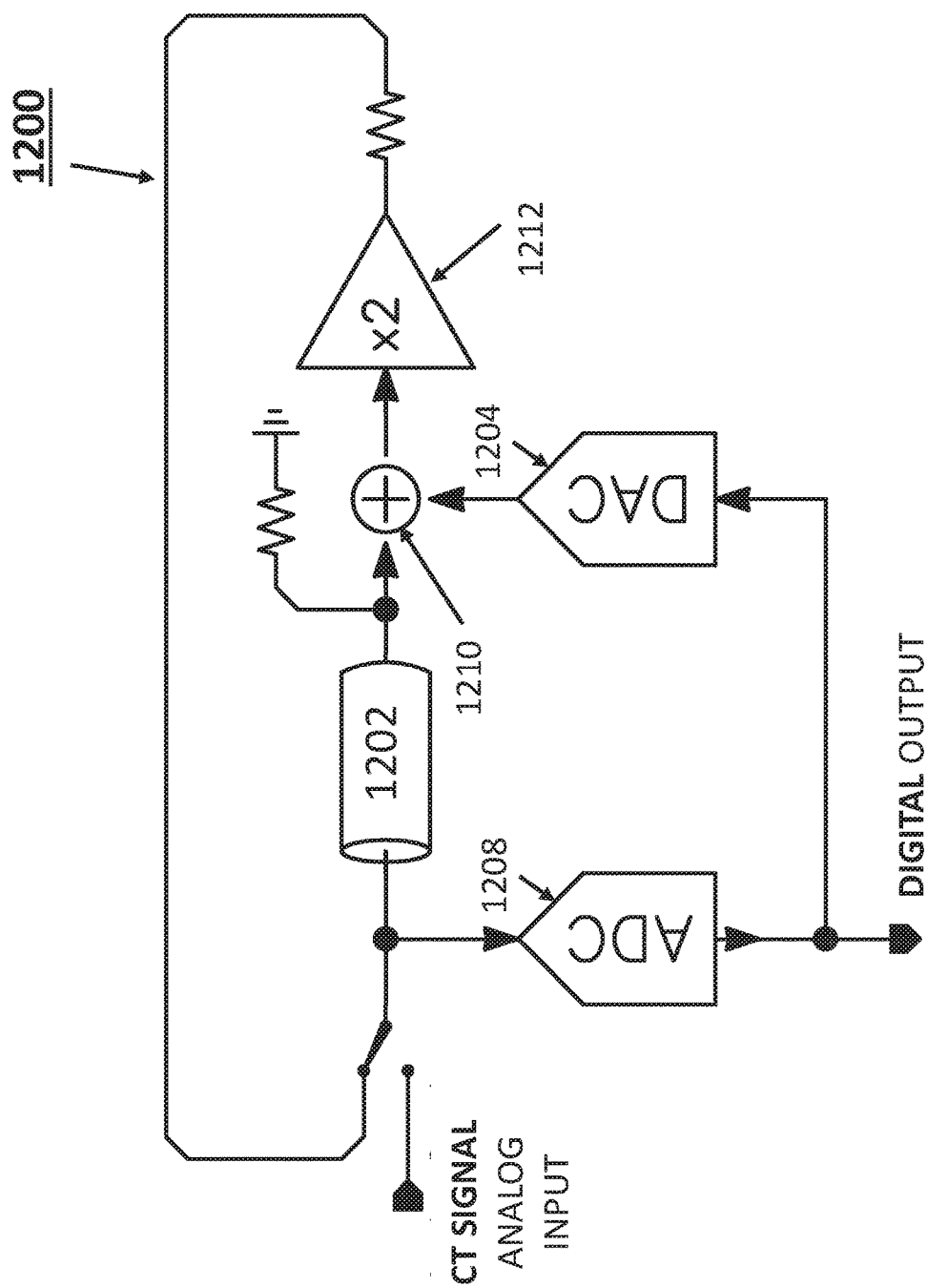
FIG. 12 illustrates an exemplary cyclic ADC having a recursively-connected delay line, according to some embodiments of the disclosure.

FIG. 12 illustrates an exemplary cyclic ADC having a recursively-connected delay line, according to some embodiments of the disclosure. The delay line 1202 captures the input signal waveform for a first step of conversion, and captures an amplified residue waveform for a subsequent step of conversion. Coarse conversion is performed by ADC 1208 at each step of conversion. The amplified residue waveform is generated by subtracting the captured input signal by the output signal from DAC 1204 using summation node 1210. The DAC 1204 provides a reconstructed signal based on the conversion performed by ADC 1208. The residue is amplified by amplifier 1212, and goes through the recursive loop for the next step of conversion.

Methods for Sampling

Figure 13:
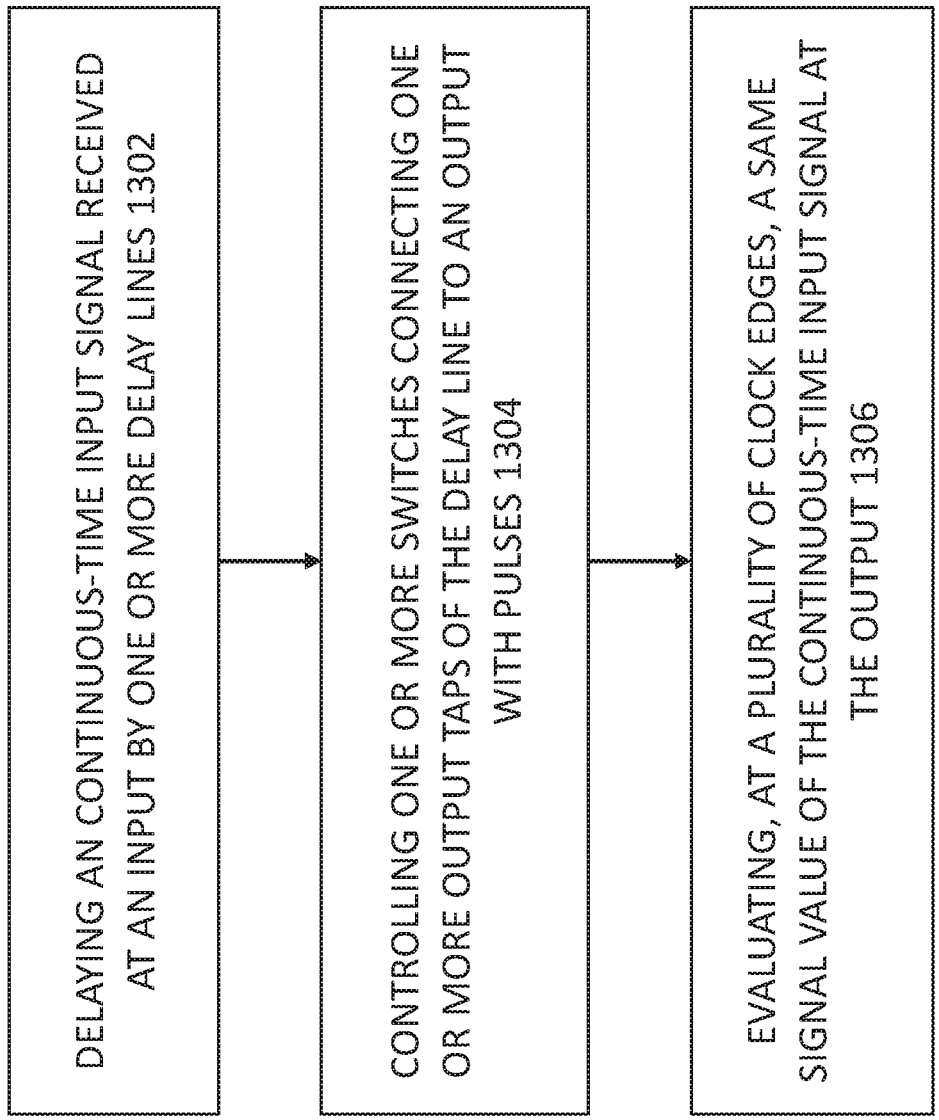
FIG. 13 is a flow diagram illustrating a method for sampling, according to some embodiments of the disclosure.

FIG. 13 is a flow diagram illustrating a method for sampling, according to some embodiments of the disclosure. In 1302, a continuous-time input signal received at an input is delayed by one or more delay lines. In 1304, one or more switches connecting one or more output taps of the delay line to an output are controlled with pulses, wherein the pulses match durations and direction of propagation delays experienced by the continuous-time input signal through the one or more delay lines. In 1306, a same signal value of the continuous-time input signal is evaluated, at a plurality of clock edges, at the output.

Figure 14:
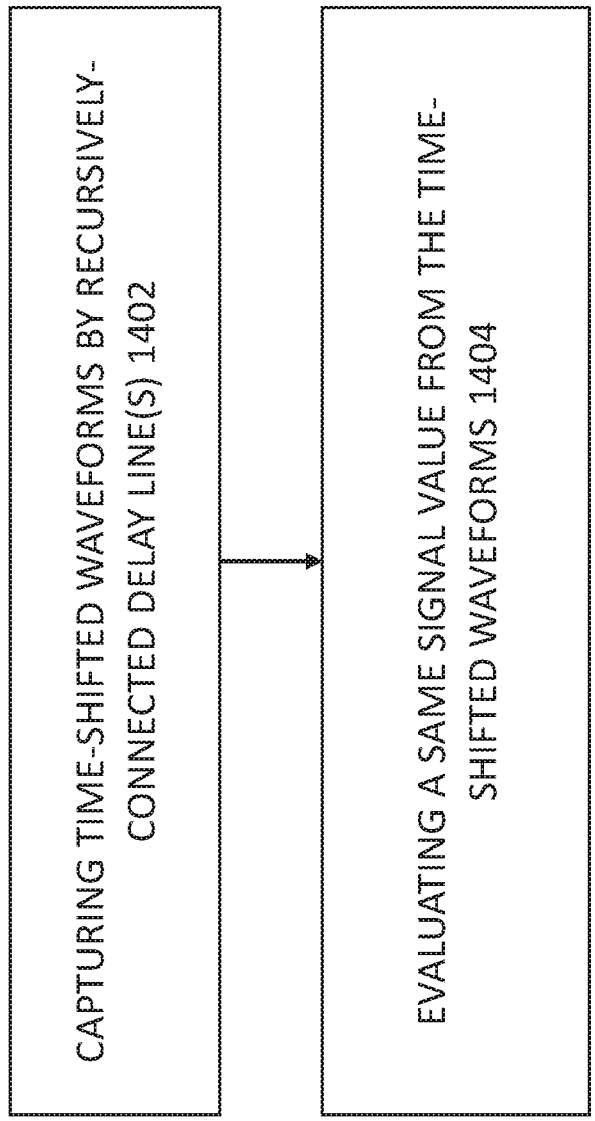
FIG. 14 is a flow diagram illustrating a method for sampling, according to some embodiments of the disclosure.

FIG. 14 is a flow diagram illustrating a method for sampling, according to some embodiments of the disclosure. In 1402, time-shifted waveforms of a continuous-time input signal received at an input are captured by one or more recursively-connected delay lines. In 1404, a same signal value from the time-shifted waveforms of the continuous-time input signal is evaluated, at a plurality of clock edges, at an output.

Exemplary Circuit Implementations of the Delay Element

The delay lines described herein can be implemented in various ways. Generally speaking, the delay lines may be terminated or impedance controlled to minimize reflection. A delay element (seen in the FIGURES) can be provided in differential form with differential signal paths (i.e., the top path from IN+ to OUT+ and the bottom path from IN– to OUT–). Advantageously, the delay element can be implemented in different ways to provide different frequency responses, desired behaviors, and/or characteristic impedances.

In some cases, the delay lines can include one or more transmission lines. A transmission line can be a conductor having a certain physical length with controlled impedance.

In some cases, the delay lines can include one or more resistor-capacitor (RC) lattice delay lines. FIG. 15-17 illustrate RC lattice delay lines, according to some embodiments of the disclosure. An RC lattice delay line can be designed to provide a certain amount of propagation delay.

Figure 18:
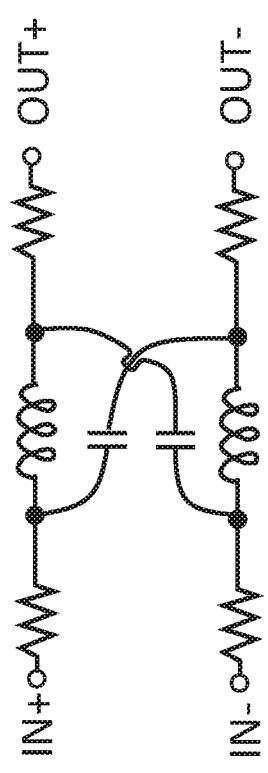
FIG. 18-19 illustrate inductor-capacitor lattice(s) delay lines, according to some embodiments of the disclosure.
Figure 19:
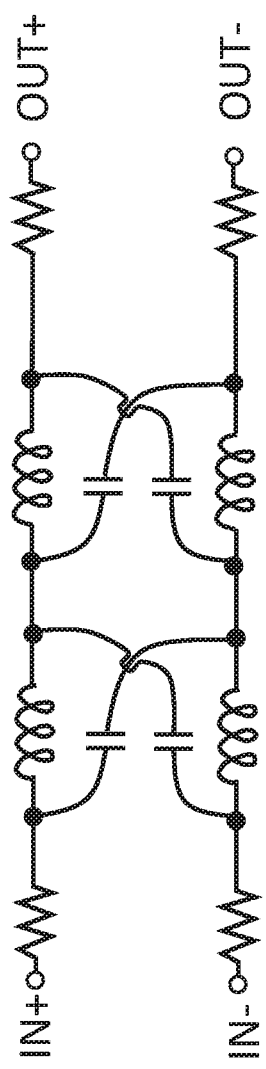

In some cases, the delay lines can include one or more inductor-capacitor (LC) lattice(s) and/or cascaded LC lattices. FIG. 18-19 illustrate inductor-capacitor (LC) lattice(s) delay lines, according to some embodiments of the disclosure. A LC lattice or cascaded LC lattice delay line can be designed to provide a certain amount of propagation delay.

Examples

Example 1 is a continuous-time sampler, comprising: an input receiving a continuous-time signal; an output; serially-connected delay lines coupled to the input; output taps along the serially-connected delay lines; and controlled switches corresponding to the output taps for connecting the output taps to the output, wherein the controlled switches are controlled by pulses matching and following signal propagation delays associated with the serially-connected delay lines.

In Example 2, the continuous-time sampler of Example 1, can optionally include: buffers for buffering respective signals at the output taps.

In Example 3, the continuous-time sampler of Examples 1 or 2, can optionally include: further serially-connected delay lines receiving a pulse, and further output taps along the further serially-connected delay lines for generating the pulses.

In Example 4, the continuous-time sampler of any one of Examples 1-3, can optionally include: further serially-connected delay lines structurally matching the serially-connected delay lines.

In Example 5, the continuous-time sampler of any one of Examples 1-4, can optionally include: the serially-connected delay lines comprising one or more transmission lines.

In Example 6, the continuous-time sampler of any one of Examples 1-5, can optionally include: the serially-connected delay lines comprising one or more resistor-capacitor lattices.

In Example 7, the continuous-time sampler of any one of Examples 1-6, can optionally include: the serially-connected delay lines comprising one or more inductor-capacitor lattices or one or more cascaded inductor-capacitor lattices.

In Example 8, the continuous-time sampler of any one of Examples 1-7, can optionally include: the output has a same signal value of the continuous-time signal at time instants defined by a plurality of consecutive clock edges when the pulses connect the output taps to the output.

In Example 9, the continuous-time sampler of any one of Examples 1-8, can optionally include: the output being connected to a comparator for comparing the output against a plurality of values generated by a digital-to-analog converter; the digital-to-analog converter being controlled by successive approximation register logic; and the successive approximation register logic being controlled by the comparator.

Example 10 is a method for sampling, comprising: delaying a continuous-time input signal received at an input by one or more delay lines; and controlling one or more switches connecting one or more output taps of the delay line to an output with pulses, wherein the pulses match durations and direction of propagation delays experienced by the continuous-time input signal through the one or more delay lines; and evaluating, at a plurality of clock edges, a same signal value of the continuous-time input signal at the output.

In Example 11, the method of Example 10, can optionally include: storing time-shifted waveforms of the continuous-time input signal in the one or more delay lines.

In Example 12, the method of Example 10 or 11, can optionally include: delaying a pulse by one or more further delay lines matching the one or more delay lines; and outputting the pulses for pulsing the one or more switches from one or more output taps of the one or more further delay lines.

In Example 13, the method of any one of Examples 10-12, can optionally include: the one or more delay lines comprising serially-connected delay lines with corresponding output taps along the serially-connected delay lines.

In Example 14, the method of any one of Examples 10-13, can optionally include: buffering one or more signals at the one or more output taps by a voltage buffer.

Example 15 is a method for sampling, comprising: capturing time-shifted waveforms of a continuous-time input signal received at an input by one or more recursively-connected delay lines; and evaluating, at a plurality of clock edges at an output, a same signal value from the time-shifted waveforms of the continuous-time input signal.

In Example 16, the method of Example 15 can optionally include: disconnecting a tab of a first recursively-connected delay line from receiving the continuous-time input signal; and connecting the tab of the first recursively-connected delay line to receive a delayed signal generated by the first recursively-connected delay lines.

Example 17 is an apparatus comprising: delay means for storing identical time-shifted waveforms of an analog input signal; output means, controlled by pulses matching propagation delays of the delay means, for outputting time-shifted waveforms of the analog input signal; and circuitry for performing analog to digital conversion based on a same signal value evaluated from the time-shifted waveforms over a plurality of clock edges.

In Example 18, the apparatus of Example 17, can optionally include: the output means comprising summing means for summing signal values from the identical time-shifted waveforms.

In Example 19, the apparatus of Example 17 or 18, can optionally include: the circuitry comprising a comparator for comparing the same signal value against different values generated by a digital-to-analog converter.

In Example 20, the apparatus of any one of Examples 17-19, can optionally include: further delay means for generating the pulses, wherein the further delay means for generating the pulses are structurally the same as the delay means to ensure matching of the propagation delays.

Example 21 is an apparatus comprising means for implementing and/or carrying out the methods of any one of Examples 10-16 and/or any of the functionalities described herein.

Other Implementation Notes, Variations, and Applications

While the embodiments described herein are described in relation to CT samplers with certain ADCs, these types of ADCs are not meant to be limiting to the disclosure. Furthermore, the embodiments described herein can be applicable to a variety of converters, including other ADC architectures employing CT circuit designs, hybrid CT and DT circuit designs (which uses switched-capacitor circuits), and DT circuit designs, etc. The present architecture for the CT samplers are particularly suitable for high-speed, high precision applications. Applications which can greatly benefit from the architecture include: instrumentation, testing, spectral analyzers, military purposes, radar, wired or wireless communications, mobile telephones (especially because standards continue to push for higher speed communications), and base stations.

Switches described herein can be implemented using transistors. When biased appropriately with proper "on" and "off" voltages, transistors can operate like a switch to close a circuit path or open a circuit path depending on the "on" and "off" voltages.

All of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the present disclosure, appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

The functions related to continuous-time sampling, such as the processes shown in FIG. 13, illustrate only some of the possible functions that may be executed by, or within, the circuits illustrated in the FIGURES or circuits coupled to the systems illustrated in the FIGURES (e.g., digital circuitry or an on-chip microprocessor). Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the disclosure, appended claims. Note that all optional features of the apparatus described above may also be implemented with respect to the method or process described herein and specifics in the examples may be used anywhere in one or more embodiments.

What is claimed is:

1. A continuous-time sampler, comprising:
    an input for receiving a continuous-time signal;
    an output;
    serially-connected delay lines coupled to the input;
    output taps along the serially-connected delay lines;
    further serially-connected delay lines, structurally matching the serially-connected delay lines, to receive a pulse, wherein a direction of propagation of the pulse is the same as a direction of propagation of the continuous-time signal;
    further output taps along the further serially-connected delay lines for generating pulses; and
    controlled switches corresponding to the output taps for connecting the output taps to the output, wherein the controlled switches are controlled by the pulses.

2. The continuous-time sampler of claim 1, further comprising:
    buffers for buffering respective signals at the output taps.

3. The continuous-time sampler of claim 1, wherein:
    the serially-connected delay lines are arranged in parallel with the further serially-connected delay lines.

4. The continuous-time sampler of claim 3, wherein an input terminal of the serially-connected delay lines to receive the continuous-time signal and an input terminal of the further serially-connected delay lines to receive the pulse are arranged on a same side.

5. The continuous-time sampler of claim 1, wherein:
the serially-connected delay lines comprise one or more transmission lines.

6. The continuous-time sampler of claim 1, wherein:
the serially-connected delay lines comprise one or more resistor-capacitor lattices.

7. The continuous-time sampler of claim 1, wherein:
the serially-connected delay lines comprise one or more inductor-capacitor lattices or one or more cascaded inductor-capacitor lattices.

8. The continuous-time sampler of claim 1, wherein:
the output has a same signal value of the continuous-time signal at time instants defined by a plurality of consecutive clock edges when the controlled switches connect the output taps to the output.

9. The continuous-time sampler of claim 1, wherein:
the output is connected to a comparator for comparing the output against a plurality of values generated by a digital-to-analog converter;
the digital-to-analog converter is controlled by successive approximation register logic; and
the successive approximation register logic is controlled by the comparator.

10. A method for sampling, comprising:
delaying a continuous-time input signal received at an input by serially-connected delay lines;
delaying a pulse by further serially-connected delay lines matching the serially-connected delay lines, wherein propagation direction of the continuous-time input signal is in a same direction as propagation direction of the pulse; and
outputting pulses at output taps along the further serially-connected delay lines;
controlling switches connecting output taps along the serially-connected delay lines to an output with the pulses; and
evaluating, at a plurality of clock edges, a same signal value of the continuous-time input signal at the output.

11. The method of claim 10, further comprising:
storing time-shifted waveforms of the continuous-time input signal in the serially-connected delay lines.

12. The method of claim 10, further comprising:
buffering signals at the output taps by a voltage buffer.

13. The method of claim 10, further comprising:
performing analog to digital conversion based on the same signal value at the output.

14. The method of claim 10, further comprising:
summing signals at the output taps of the serially-connected delay lines to generate the same signal value at the output.

15. The method of claim 10, further comprising:
comparing the same signal value against different values generated by a digital-to-analog converter.

16. An apparatus for sampling, comprising:
first means for delaying a continuous-time input signal received at an input;
second means for delaying a pulse and for outputting pulses to control switches connecting output taps of the first means to an output, wherein the second means structurally matches the first means, and propagation direction of the continuous-time input signal in the first means is in a same direction as propagation direction of the pulse in the second means; and
means for evaluating, at a plurality of clock edges, a same signal value of the continuous-time input signal at the output.

17. The apparatus of claim 16, wherein the first means store time-shifted waveforms of the continuous-time input signal.

18. The apparatus of claim 16, further comprising:
means for summing signals at the output taps of the first means to generate the same signal value at the output.

19. The apparatus of claim 16, further comprising:
means for comparing the same signal value against different values generated by a digital-to-analog converter.

20. The apparatus of claim 16, further comprising:
means for buffering signals at the output taps by a voltage buffer.

* * * * *